(12) United States Patent
Ko et al.

(10) Patent No.: US 10,393,991 B2
(45) Date of Patent: Aug. 27, 2019

(54) MEMS DEVICE

(71) Applicant: LG INNOTEK CO., LTD., Seoul (KR)

(72) Inventors: Yong Jun Ko, Seoul (KR); Sang Won Seo, Seoul (KR); Jeong Gi Seo, Seoul (KR); Chul Kim, Seoul (KR); Don Han Jun, Seoul (KR); Wan Seop Choi, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 261 days.

(21) Appl. No.: 14/784,802

(22) PCT Filed: Apr. 21, 2014

(86) PCT No.: PCT/KR2014/003442
§ 371 (c)(1),
(2) Date: Oct. 15, 2015

(87) PCT Pub. No.: WO2014/171799
PCT Pub. Date: Oct. 23, 2014

(65) Prior Publication Data
US 2016/0062076 A1    Mar. 3, 2016

(30) Foreign Application Priority Data
Apr. 19, 2013 (KR) .................. 10-2013-0043781

(51) Int. Cl.
*G02B 7/02* (2006.01)
*G02B 26/08* (2006.01)
(Continued)

(52) U.S. Cl.
CPC .............. *G02B 7/09* (2013.01); *B81B 3/0024* (2013.01); *B81B 7/02* (2013.01); *G02B 7/028* (2013.01);
(Continued)

(58) Field of Classification Search
CPC .......... H02N 1/006; B81B 7/208; B81B 7/02; G02C 11/10; G02B 7/028; G02B 7/08;
(Continued)

(56) References Cited

U.S. PATENT DOCUMENTS 5,954,079 A    9/1999 Barth et al.
6,501,210 B1   12/2002 Ueno
(Continued)

FOREIGN PATENT DOCUMENTS

JP    H10-038110 A      2/1998
JP    H1038110 A    *   2/1998    ................ F15C 5/00
(Continued)

OTHER PUBLICATIONS

International Search Report dated Aug. 14, 2014 issued in Application No. PCT/KR2014/003442.

*Primary Examiner* — Dawayne Pinkney
(74) *Attorney, Agent, or Firm* — KED & Associates LLP

(57) ABSTRACT

The disclosure provides a MEMS device including: a fixed substrate having a cavity; a driving unit disposed in the cavity and floating above the fixed substrate; and an elastic unit for physically connecting the fixed substrate with the driving unit and varying the height of the driving unit according to a control current, wherein the elastic unit includes a bimorph driving unit connected to the fixed substrate and bent according to the control current, a spring connected to the driving unit, and a frame connecting the bimorph driving unit to the spring. Therefore, in order to overcome the limitations according to the power consumption and the size-reduction due to a coil and a magnet, the MEMS device drives one lens and thus can reduce the power consumption and the size thereof.

12 Claims, 13 Drawing Sheets

(51) Int. Cl.
*G02B 26/00* (2006.01)
*G02B 7/09* (2006.01)
*G02B 7/08* (2006.01)
*G03B 3/10* (2006.01)
*B81B 7/02* (2006.01)
*H02N 1/00* (2006.01)
*B81B 3/00* (2006.01)

(52) U.S. Cl.
CPC ................. *G02B 7/08* (2013.01); *G03B 3/10* (2013.01); *H02N 1/006* (2013.01); *B81B 2201/032* (2013.01); *B81B 2201/047* (2013.01); *B81B 2203/0163* (2013.01); *B81B 2203/053* (2013.01)

(58) Field of Classification Search
CPC . G02B 3/10; G02B 6/102; G02B 6/26; G08B 5/36
USPC ........................................... 359/824
See application file for complete search history.

(56) References Cited

U.S. PATENT DOCUMENTS

| | | | | |
|---|---|---|---|---|
| 6,812,820 | B1* | 11/2004 | Fouillet | H01H 1/0036 337/333 |
| 7,656,073 | B2* | 2/2010 | Doshida | G02B 3/12 310/330 |
| 2002/0195892 | A1* | 12/2002 | Okamoto | H02N 2/163 310/81 |
| 2004/0125472 | A1* | 7/2004 | Belt | G02B 26/0858 359/847 |
| 2005/0249487 | A1* | 11/2005 | Gutierrez | G02B 7/102 396/85 |
| 2010/0307150 | A1* | 12/2010 | Wu | B81B 3/0024 60/528 |

FOREIGN PATENT DOCUMENTS

| | | |
|---|---|---|
| KR | 10-2010-0097943 A | 9/2010 |
| KR | 10-2013-0035522 A | 4/2013 |

* cited by examiner

MEMS DEVICE

CROSS-REFERENCE TO RELATED PATENT APPLICATIONS

This application is a U.S. National Stage Application under 35 U.S.C. 5371 of PCT Application No. PCT/KR2014/003442, filed Apr. 21, 2014, which claims priority to Korean Patent Application No. 10-2013-0043781, filed Apr. 19, 2013, whose entire disclosures are hereby incorporated by reference.

TECHNICAL FIELD

The embodiment relates to a micro electro mechanical systems (MEMS) device.

BACKGROUND ART

CCD (Charge Coupled Device) sensors and CMOS (Complementary Metal Oxide Semiconductor) sensors are types of 2-dimensional sensors for photographing moving pictures and stationary pictures and main elements in the configuration of electronic cameras. Specifically, the CCD sensors show more excellent characteristics in picture quality than the CMOS sensors, but, because of its power consumption and complex configuration, the market share of the CMOS sensors is becoming higher, and, currently, the picture quality of the CMOS sensors is improving. As these sensors become developed, the uses of digital cameras are becoming universal, and cameras are being installed on mobile phones such as cellular phones.

Typical camera modules employ VCM (Voice Coil Motor) for automatic focus drivers as disclosed in KR 2013-0035522.

The VCM includes a barrel configured by a coil and a magnet and including multiple lenses, in which the barrel is supported by springs disposed at upper and lower parts of the barrel. The springs disposed at the upper and lower parts guide the linear motion of the driver, and when the VCM is not operated, return the lens barrel to the initial position.

The operating principle of the VCM is as follows.

The VCM is driven in the optical axis direction of the lens by Lorentz force generated when current flows through the coil in a magnetic field formed by the magnet. The VCM transforms electrical energy to mechanical energy by the generated force.

Currently, as mobile phones and mobile electronic devices require light weight, small size, thin thickness and low power consumption, camera modules installed in these products also require low power consumption and size reduction. Accordingly, there are needs for low power/size reduction for the automatic focus device provided in the camera module.

However, the automatic focus device used in typical mobile phones needs to drive the barrel including the lenses by a VCM scheme, so large power consumption is required. In addition, because the coil and magnet positioned near the barrel are used to drive the barrel in a direction vertical to the optical axis, size reduction is difficult. Thus, a new automatic focus device is in demand.

DISCLOSURE

Technical Problem

The embodiment provides a micro electro mechanical systems device (MEMS) having low power consumption and reduced size, and a camera module including the same.

Technical Solution

A MEMS device according to the embodiment includes: a fixed substrate having a first cavity; a driving unit disposed in the first cavity and floating above the fixed substrate; and an elastic unit for physically coupling the fixed substrate to the driving unit and varying a height of the driving unit according to a control current, wherein the elastic unit includes a bimorph driving unit coupled to the fixed substrate and bent according to the control current, a spring coupled to the driving unit, and a frame coupling the bimorph driving unit to the spring.

The bimorph driving unit includes a first material layer, a thermal emission layer disposed on the first material layer, and a second material layer disposed on the thermal emission layer, wherein the first material layer and the second material layer have mutually different thermal expansion coefficients.

The elastic unit further includes an insulation layer between the thermal emission layer and the second material layer.

The thermal emission layer emits heat according to the control current, and the first material layer has the thermal expansion coefficient lower than the thermal expansion coefficient of the second material layer.

The driving unit includes a plurality of second cavities to receive the spring. The frame includes a first extension unit expanding from an end of the bimorph driving unit, and a second extension unit to connect both ends of the first extension unit, wherein the first extension unit is configured as an arc.

The second extension unit has a straight shape and connects both ends of the first extension unit.

The elastic unit includes a plurality of springs for one bimorph driving unit.

The thermal emission layer has a plurality of patterns, mutually different voltages are applied to the plurality of the bimorph driving units and the patterns of the thermal emission layer of each bimorph driving unit include patterns to which mutually different voltages are applied and grounded patterns connected to the patterns.

The driving unit includes a reflective layer formed on a surface of the driving unit and the driving unit includes an opening part formed in the driving unit to receive a lens.

Advantageous Effects

The MEMS device according to the embodiment drives one lens to overcome the limitation of power consumption and size reduction due to the coil and the magnet, so the power consumption is low and size reduction is possible.

In addition, the structure can be simplified by employing a thermal scheme in which the automatic focus function is performed through the vertical driving caused by a thermal expansion difference of mutually different materials so that the cost can be saved.

BEST MODE

Mode for Invention

The embodiment will be clearly understandable to those of ordinary skill in the art from the disclosures provided below with reference to the accompanying drawings. But, it should be understood that the disclosure is not limited to the following embodiments and may be embodied in different ways.

When a predetermined part "includes" a predetermined component, the predetermined part does not exclude other components, but may further include other components unless otherwise indicated.

The disclosure provides a micro electro mechanical systems (MEMS) device employed to an automatic focus driving unit.

Hereinafter, a MEMS device according to the embodiment will be described with reference to FIGS. 1 to 5.

Figure 1:
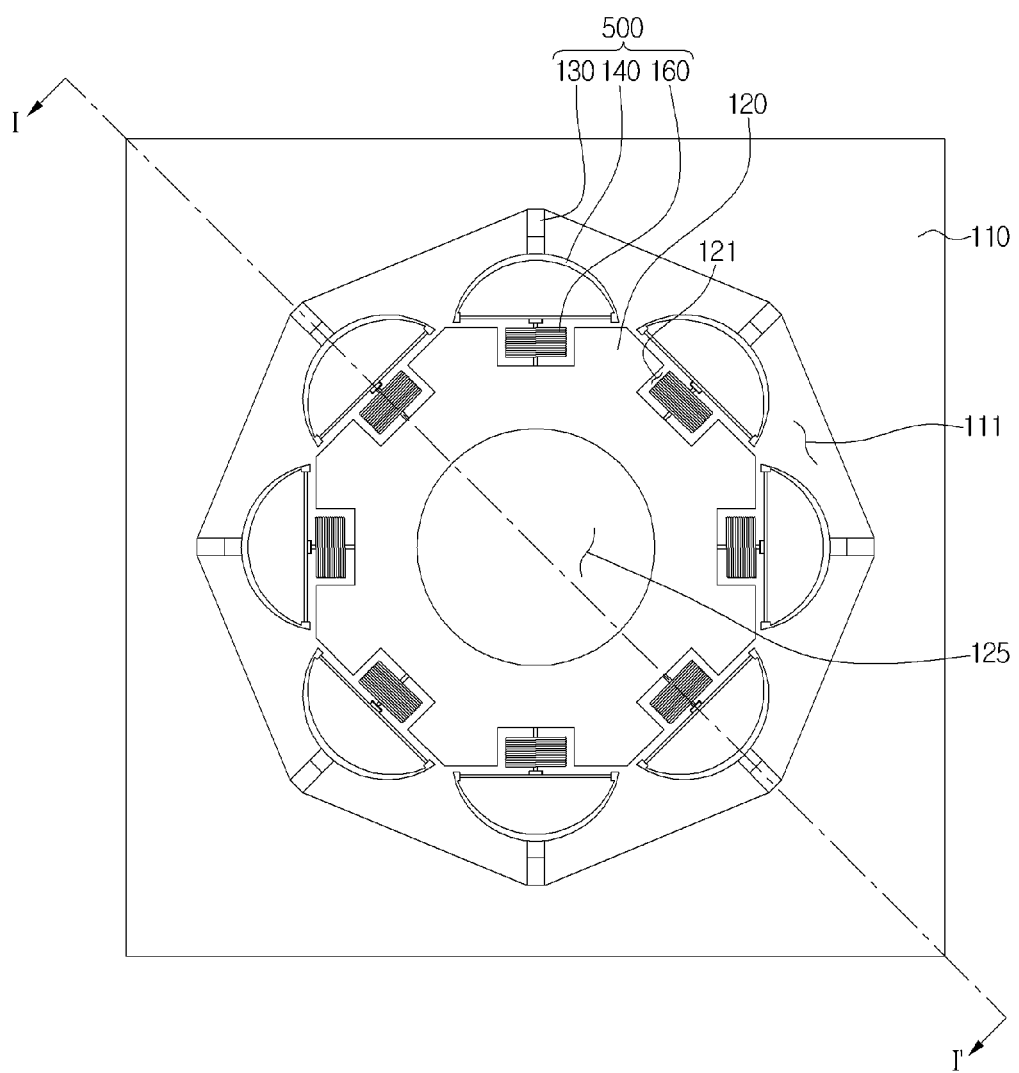
FIG. 1 is a top view showing a MEMS device according to the embodiment.
Figure 2:
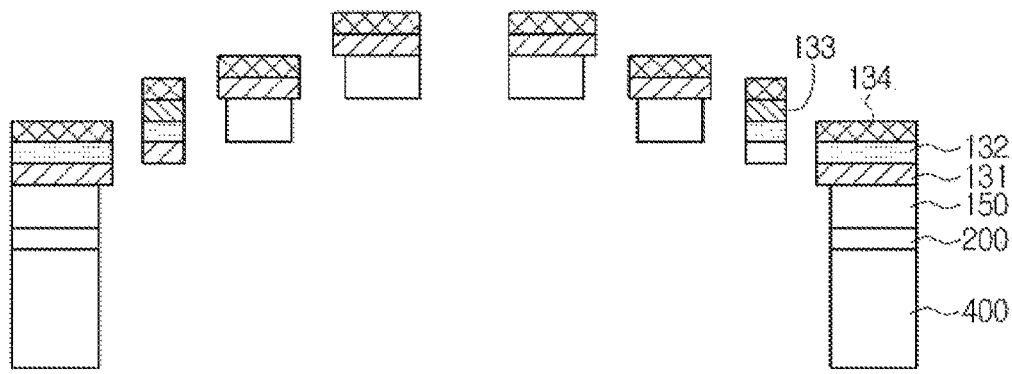
FIG. 2 is a sectional view of FIG. 1.
Figure 3:
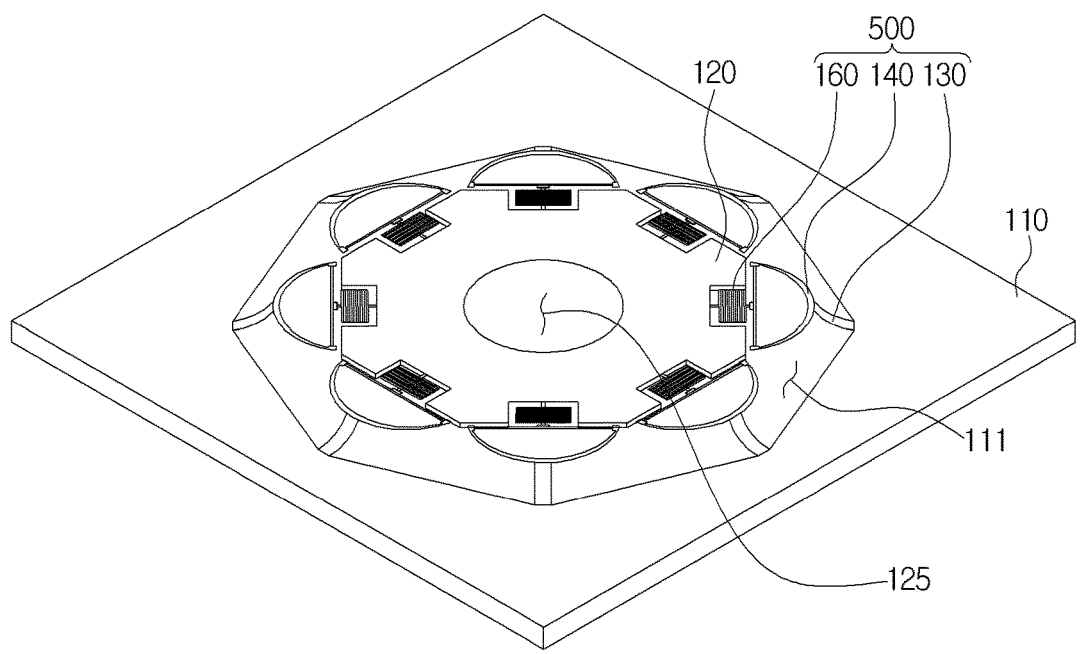
FIG. 3 is a perspective view of FIG. 1.
Figure 4:
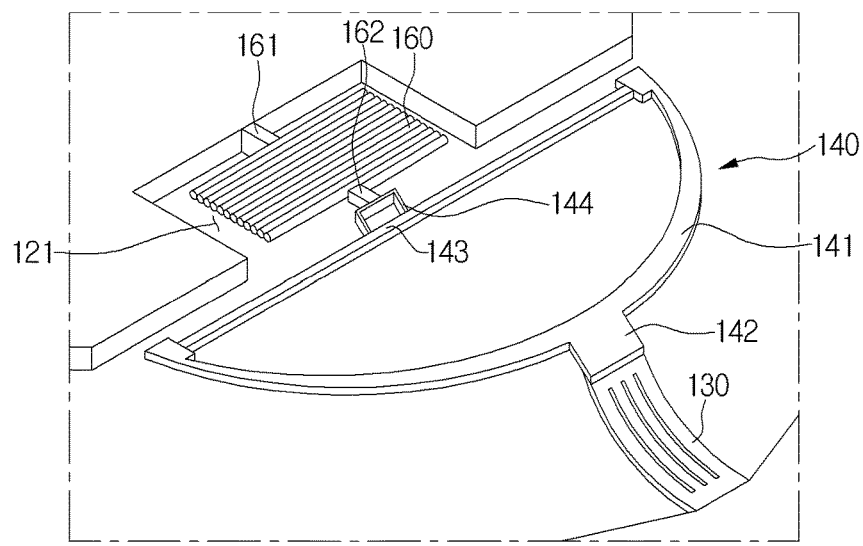
FIG. 4 is an enlarged view of A of FIG. 3.
Figure 5:
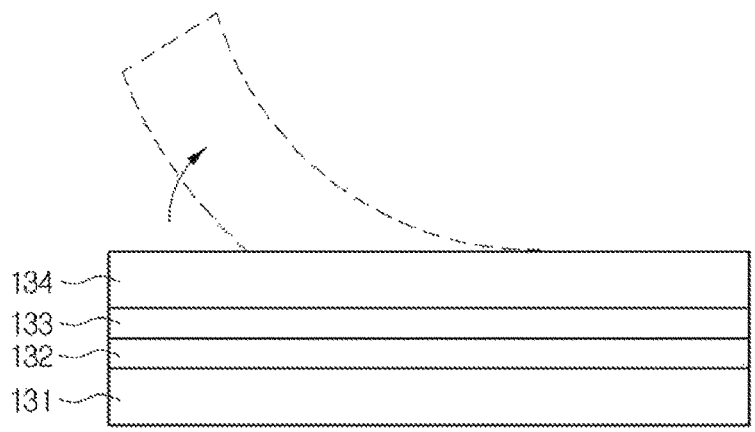
FIG. 5 is a sectional view of a bimorph.
Figure 6:
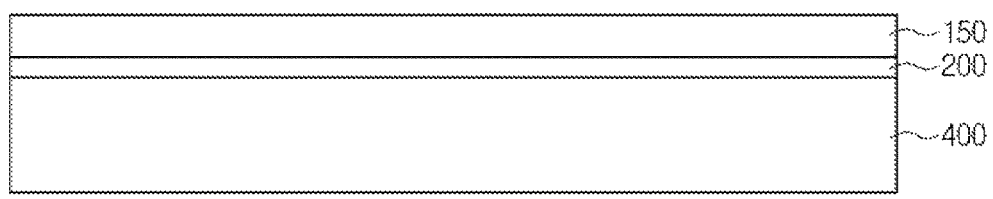
FIGS. 6 to 13 are sectional views to explain a method of manufacturing the MEMS device of FIG. 1.

FIG. 1 is a top view showing a MEMS device according to the embodiment, FIG. 2 is a sectional view of FIG. 1, FIG. 3 is a perspective view of FIG. 1, FIG. 4 is an enlarged view of A of FIG. 3, and FIG. 5 is a sectional view of a bimorph.

Referring to FIG. 1, the MEMS device 100 according to the embodiment includes a fixed substrate 110, a driving unit 120 and a plurality of elastic units 500.

The fixed substrate 110 supports the driving unit 120 and the elastic units 500.

The fixed substrate 110 has a plate shape formed therein with a cavity to receive the fixing part 120, and may have a rectangular frame shape. The fixed substrate 111 may have a square shape and have an area of 6 mm×6 mm.

The shape of the cavity 111 may be any one of a circular shape and a polygonal shape, and the shape may be determined according to the number of the elastic units 500.

In other words, in the case of 8 elastic units 500 as shown in FIG. 1, the cavity 111 may have a regular octagonal shape.

The fixed substrate 110 may have a multiple layer structure, and as shown in FIG. 2, include a supporting substrate 400, an insulation layer 200 disposed on the supporting substrate 200, an electrode layer 150 disposed on the insulation layer 200, a first material layer 131, a thermal emission layer 132 and a second material layer 134.

The supporting layer 400 may be a silicon substrate, a glass substrate or a polymer substrate.

The supporting layer 400 may have a thickness of 300 to 500 μm, and preferably a thickness of 400 μm.

The supporting substrate 400 is formed on the insulation layer 200.

The insulation layer 200, if the supporting substrate 400 includes the silicon substrate, may include a silicon oxidized layer or a silicon nitride layer and have a thickness of about 1.5 μm.

The electrode layer 150 is formed on the insulation layer 200.

In other words, although the electrode layer 150 may be patterned to include a plurality of electrode pieces, the electrode layer 150 may include one electrode layer 150 as shown in FIG. 1.

The electrode layer 150 may include a conductive material such as silicon, copper, aluminum, molybdenum, tungsten, etc., and preferably formed by silicon when the supporting substrate 400 includes the silicon substrate. The electrode layer 150 has a thickness of 50 to 60 μm, and preferably has a thickness of about 50 μm.

The first material layer 131, the thermal emission layer 132 and the second material layer 134 disposed on the electrode layer 150 have a layer structure constituting a bimorph driving unit 130, and will be described in detail below.

The layer structure disposed on the electrode layer 150 may protrude higher than the electrode 150, as shown in FIG. 2.

Meanwhile, the driving unit 120 is disposed in the cavity 111 formed on the fixed substrate 110.

The driving unit 120 is formed therein with an opening part 125 and a small opening part 121 is formed in a region to which each elastic unit 500 is connected.

The driving unit 120 may have a polygonal shape as shown in FIG. 1, and have the number of surfaces same as the number of the elastic units 500 such that the elastic units 500 may be connected with each other in the small opening part 121 formed in each surface.

Therefore, in the case of 8 elastic units 500 as shown in FIG. 1, an octagonal shape, to which the surface of each elastic unit 500 is disposed, may be formed, and the vertex of the cavity 111 of the fixed substrate 110 and the vertex of the driving unit 120 may not be aligned with each other.

The driving unit 120 includes the electrode layer 150 at a lower part thereof, the first material layer 131 disposed on the electrode layer 150 and the second material layer 134 disposed on the first material layer 131.

In other words, the driving unit 150 floats with respect to the fixed substrate 110 while the insulation layer 200 and the supporting substrate 400 are removed from the lower part of the electrode layer 150.

In this case, the height of the electrode layer 150 of the driving unit 120 may be higher than the height of the electrode layer 150 of the fixed substrate 110, and the electrode layer 150 has a width narrower than the upper first and second material layers 131 and 134 such that a step difference is formed between the first material layer 131 and the electrode layer 150.

Meanwhile, the MEMS device 100 includes a plurality of elastic units 500.

The elastic units 500 physically couple the fixed substrate 110 and the driving unit 120, and control the height of the driving unit 120 according to the voltage applied from the outside.

The elastic units 500 may have the same structure and are uniformly spaced apart from each other for a balance of force.

Each elastic unit 500 includes the bimorph driving unit, the frame 140 and the spring 160.

The bimorph driving unit 130 directly couples the fixed substrate and the frame 140, and when heat is generated according to the voltage applied from the fixed substrate, the bending angle varies according to the difference between the thermal expansion coefficients of the two material layers.

The height of the driving unit is determined by the angle variation.

The detailed structure of the bimorph driving unit 130 is as shown in FIG. 5.

Referring to FIG. 5, the bimorph driving unit 130 includes the first material layer 131, the thermal emission layer 132 disposed on the first material layer 131, the insulation layer 133 disposed on the thermal emission layer 132 and the second material layer 134 disposed on the insulation layer 133.

When current flows through the thermal emission layer 132, heat is generated, and the length difference occurs by the thermal expansion coefficient difference of the first material layer 131 and the second material layer 134 according to the heat, thus a vertical displacement of the bimorph driving unit 130 is generated.

In this case, the thermal emission layer 132 includes metal including platinum, copper, etc. having high thermal emission, the first material layer 131 has a large thermal expansion coefficient difference with respect to the second material layer 134, and the second material layer 134 has a higher thermal expansion coefficient than that of the first material layer 131 such that the second material layer 134 is elongated more than the first material layer 131.

The first material layer 131 may include a material selected from the group consisting of Si, P—Si, SiO2, Si3N4, Cr and W, and the second material layer 131 may include a material selected from the group consisting of Al, Au, Cu, Ni and Pt.

The thermal expansion coefficient of each material layer is as the table shown below.

TABLE 1

| First material layer (131) | Si | 2.6 (10−6/K) |
|---|---|---|
|  | P—Si | 2.8 |
|  | SiO2 | 0.5 |
|  | Si3N4 | 1.6 |
|  | Cr | 4.9 |
| Second material layer (134) | Al | 23.1 |
|  | Au | 14.1 |
|  | Cu | 16.8 |
|  | Ni | 12.7 |

In other words, as shown in Table 1, the thermal expansion coefficient of the first material layer 131 satisfies 5*10−6/K or lower, and the thermal expansion coefficient of the second material layer 134 satisfies 12*10−6/K or higher.

The insulation layer 133 may include silicon oxide or silicon nitride, and insulates the thermal emission layer 132 and the first material 134.

The bimorph driving unit 130 may be formed in a bar shape protruding from the fixed substrate 110 and floating over the fixed substrate 110 as shown in FIG. 1, and the thermal emission layer 132 is coupled to the fixed substrate 110 such that current flows.

The thermal emission layer 132 may be formed in a plurality of patterns as shown in FIG. 3, and same currents may flow through each pattern or, in the case of the fixed substrate 110 formed in multiple patterns, mutually different currents may flow.

The frame 140 is coupled between the bimorph driving unit 130 and the spring 160, insulates the bimorph driving unit 130 and the spring 160, and moves the driving unit 120 according to the operation of the bimorph driving unit 130.

The frame 140, as shown in FIG. 1, includes a first coupling part 142 coupled to the bimorph driving unit 130, a first extension unit 141 forming an arc by extending in both direction from the first coupling part 142, a second extension unit 143 to mutually couple ends of the first extension unit 141, and a second coupling part 144 to couple the second extension unit 143 and the spring 160.

The first and second coupling parts 142 and 144 have a layer structure the same as the first and second extension units 141 and 143.

The first coupling part 142 may have a bar shape having the same width as that of the bimorph driving unit 130 as shown in FIG. 4.

The first extension unit 141 extends from both ends of the first coupling part 142 and forms an arc.

The first extension unit 142 may have a width becoming narrower toward the end as shown in FIG. 4.

The second extension unit 143 couples both ends of the first extension unit 142 in a straight line and has a constant width. The second extension unit 143 faces each surface of the driving unit 120, and the length of the second extension unit 143 may be shorter than the length of each surface of the driving unit 120.

The first and second extension units 141 and 143 form a bow shape.

The second coupling part 144 is attached to a center region of the second extension unit 143 and is coupled to an end part 162 of the spring 160 at a center region of the spring 160.

Although the second coupling part 144 may be formed in a surface structure that protrudes like the first coupling part 142, the second coupling part 144 may have a leaf spring shape as shown in FIG. 4.

The frame 140 moves up and down by the operation of the bimorph driving unit 130 such that the height of the driving unit may be controlled.

The frame 140 may have a layer structure of the electrode layer 150, the first material layer 131 and the second material layer 134 as shown in FIG. 2, in which the first material layer 131 has a step difference such that the first material layer 131 protrudes from the electrode layer 150.

The frame 140 is disposed at a high position from the bimorph driving unit 130.

The spring 160 is disposed in each small opening part of the driving unit 120, in which one end 161 of the spring 160 is coupled to a center part of a bottom surface of each small opening parts 121 and the other end 162 is coupled to the second coupling unit 144.

The spring 160 is bent such that the spring 160 is extended toward a direction where the spring 160 is coupled to the frame 140, and the stacked structure of the spring 160 is the same as the frame 140.

In addition, the height of the spring 160 may be higher than the height of the frame 140.

Accordingly, in the disclosure, the coupling structure of the bimorph driving unit 130, the frame 140 and the spring 160 is provided between the fixed substrate 110 and the driving unit 120, such that various displacements may be provided when the height of the driving unit 120 is varied according to the movement of the bimorph driving unit 130.

Hereinafter, the method of manufacturing the MEMS device of the embodiment will be described with reference to FIGS. 6 to 13.

Figure 10:
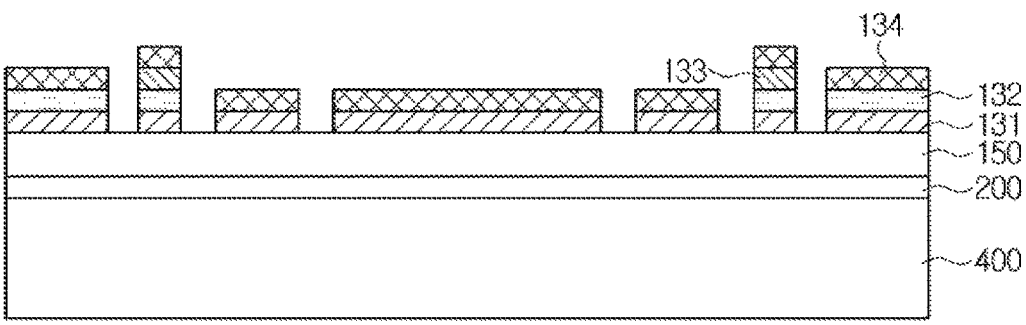

First, a base substrate is prepared as shown in FIG. 10.

The base substrate has a structure in which the insulation layer 200 and the electrode layer 150 are formed on the supporting substrate 400.

The supporting layer 400 may have a thickness of 300 to 500 μm, and preferably a thickness of 400 μm.

The insulation layer 200, if the supporting substrate 400 includes the silicon substrate, may include the silicon oxidize layer or the silicon nitride layer and have a thickness about 1.5 µm.

The electrode layer 150 may include a conductive material such as silicon, copper, aluminum, molybdenum, tungsten, etc., and preferably formed by silicon when the supporting substrate 400 includes the silicon substrate. The electrode layer 150 has a thickness of 50 to 60 µm, and preferably has a thickness of about 50 µm.

In other words, the base substrate may include a silicon substrate including the silicon insulation layer 200, and external insulation layers may be formed on upper and lower parts of the supporting substrate 400 and the electrode layer 150.

Figure 7:
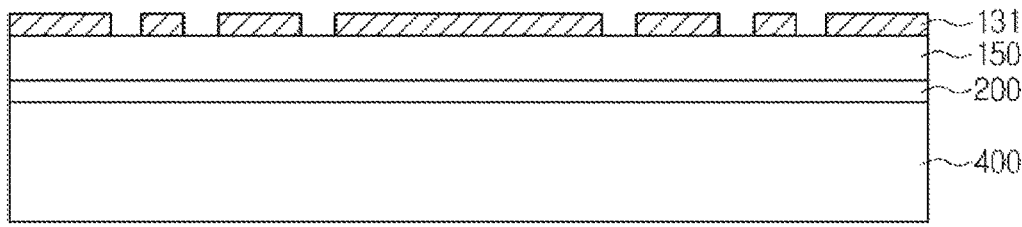

Next, the first material layer 131 is formed on the electrode layer as shown in FIG. 7.

The first material layer 131 may be formed by depositing a material selected from the group consisting of Si, P—Si, SiO2, Si3N4, Cr and W, and the first material layer 131 is patterned and formed on the fixed substrate, the elastic unit 500 and the driving unit 120.

In this case, the first material layer 131 is essentially formed in the bimorph driving unit 130 of the elastic unit 500, but may be omitted in other regions.

Figure 8:
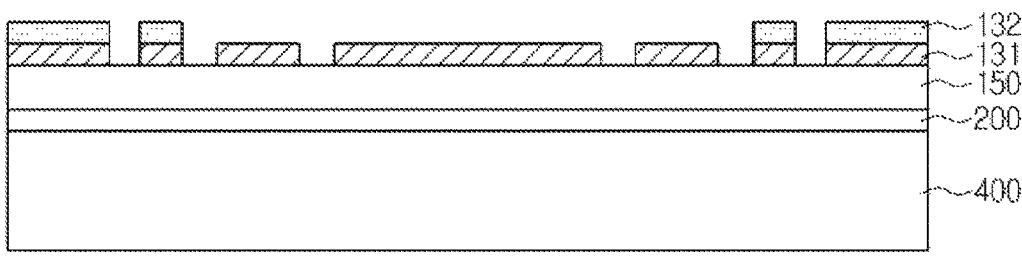

Next, the thermal emission layer 132 is formed as shown in FIG. 8.

The thermal emission layer 132 is essentially formed on the fixed substrate and the bimorph driving unit 130.

The thermal emission layer 132 may be formed in circuit patterns for transferring currents, and the thermal emission layer 132 formed on the bimorph driving unit 130 generates heat by the current flowing through the corresponding layer.

The thermal emission layer 132 may be formed by selectively depositing or patterning conductive material such as platinum or copper.

Figure 9:
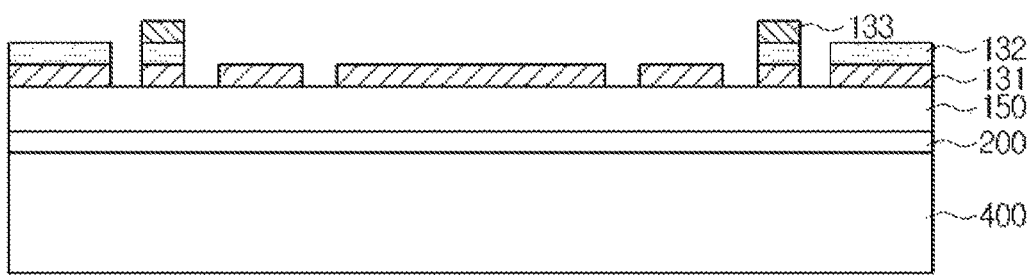

Next, the insulation layer 133 of FIG. 9 is formed on the thermal emission layer 132 of the bimorph driving unit 130.

The insulation layer 133 may include silicon oxide or silicon nitride, and the material may be deposited and then patterned or selectively patterned.

Next, the second material layer 134 is formed on the insulation layer 133 as shown in FIG. 10.

The second material layer 134 maybe formed by depositing by a material selected from the group consisting of Al, Au, Cu, Ni, Pt, then selectively patterning.

In this case, the second material layer 134 may be formed to correspond with the first material layer 132, but may be formed only on the bimorph driving unit.

Figure 11:
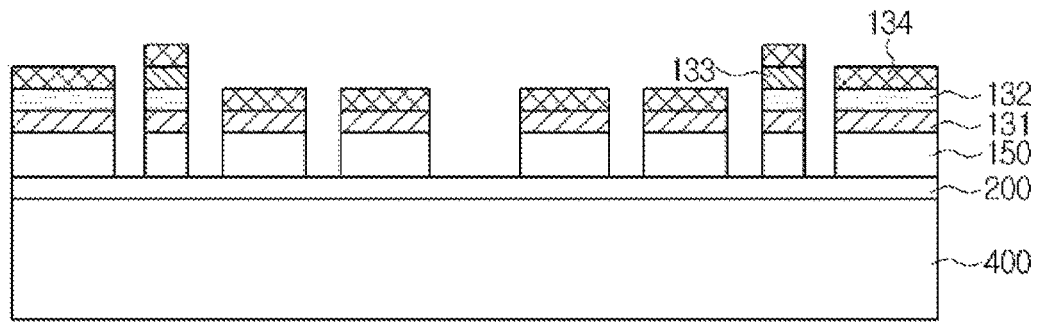

Next, the electrode layer is patterned as shown in FIG. 11.

The electrode layer may be formed by removing the region except for a region for a driving substrate, the elastic unit 500 and the driving unit, and may be formed by performing DRIE (deep reactive-ion etching).

Figure 12:
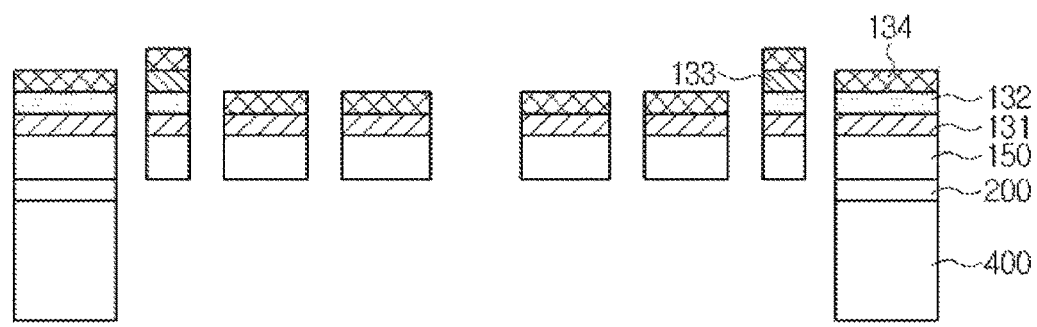

Next, as shown in FIG. 12, a backside DRIE is performed to remove the supporting substrate 400 and the insulation layer 200 of the region except for a region for the fixed substrate 110.

Thus, the floating state of the elastic unit 500 and the driving unit 120 with respect to the fixed substrate 110 is maintained.

Figure 13:
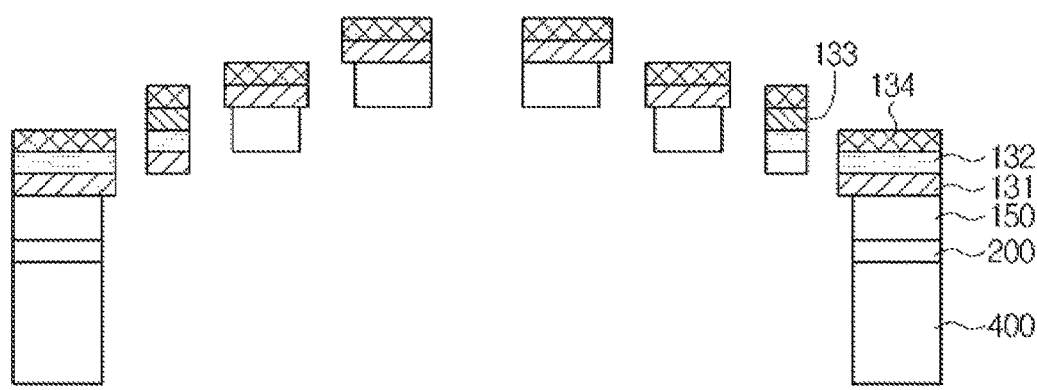

Lastly, isotropic etching is performed at the backside as shown in FIG. 13 to remove the electrode layer 150 formed at a lower surface of the bimorph driving unit 130.

In this case, a part of the side surface of the electrode layer 150 is etched by the isotropic etching to form a step difference between the first material layer 131 and the electrode layer 150.

Accordingly, the first material layer 131 is exposed through a lower part of the bimorph driving unit 130, and the second material layer 134 is exposed through an upper part of the second material layer 134, so the bimorph driving unit 130 is thin. In addition, by heat treatment during etching, the driving unit 120 is formed higher than the fixed substrate 110 by the thermal expansion coefficient difference between the first material layer 131 and the second material layer 134.

In the MEMS device 100, when current is applied to the thermal emission layer 132 of the fixed substrate 110, heat is generated in the thermal emission layer 132 of the bimorph driving unit 130 according to the current value, and the first and second material layers 131 and 134 expand according to the generated heat. In this case, the first material layer 131 has a smaller thermal expansion compared to the second material layer 134, so as more heat is generated, the bimorph driving unit 130 is bent upward.

Therefore, the frame 140 and the spring 160 move upward according to the bimorph driving unit 130, and accordingly, the driving unit 120 moves upward.

In this case, because the same amount of current flows through the multiple elastic units 500 such that the elastic units 500 move identically upward, the driving unit 120 uniformly moves upward from all directions coupled to the elastic unit 500.

Hereinafter, various examples of application will be described with reference to FIGS. 14 to 18.

Figure 14:
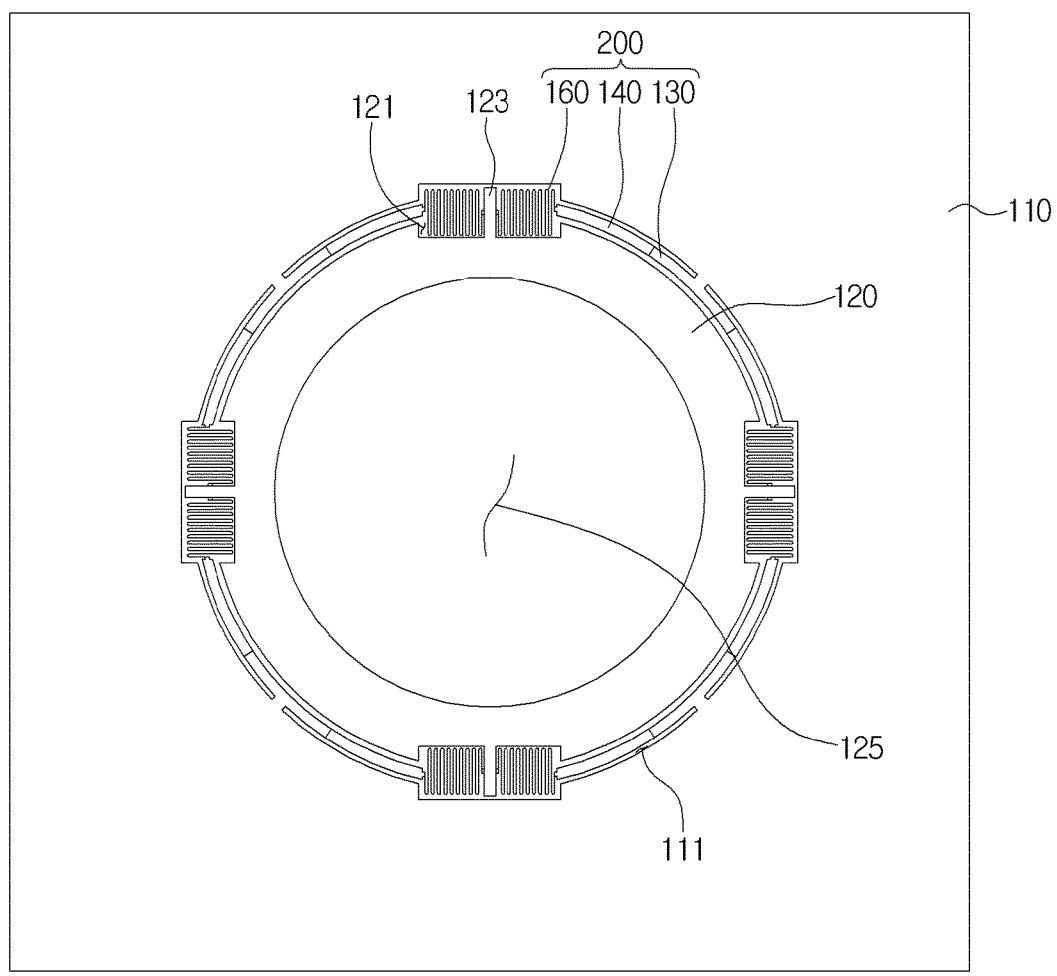
FIGS. 14 to 18 show various application examples.

The MEMS device 100A of FIG. 14 includes the fixed substrate, the elastic unit 200 and the driving unit 120 as shown in FIG. 1.

The stacked structure of each configuration of the MEMS device 100A is the same as FIG. 2, so its description will be omitted and the upper surface structure will be described.

The fixed substrate 110 of the MEMS device 100A of FIG. 14 includes the cavity 111 of a circular shape, and the driving unit 120 of a circular shape is included in the cavity 111.

The multiple elastic units 500 are included between the driving unit 120 and the fixed substrate 110.

Each elastic unit 500 includes the bimorph driving unit 130, the frame 140 and the spring 160.

The bimorph driving unit 130 is formed around a circumference of the driving unit 120, and the frame 140 is formed between the end of the bimorph driving unit 130 and the spring 160.

The frame 140 is formed in a bar type which is bent around the circumference of the driving unit 120.

The end of the frame 150 is coupled to the spring 160.

The driving unit 160 includes a plurality of small cavities 111 to receive the spring 160, and two springs 160 may be disposed in one small cavity 111.

In each small cavity 111, a protrusion unit 123, which protrudes from a body of the driving unit 120 to segment the small opening part 121, is formed.

Each spring 160 is disposed between one side surface of the small opening part 121 and one surface of the protrusion unit 123, such that the position of the driving unit 120 may be varied by moving the protrusion unit 123 up or down.

Figure 15:
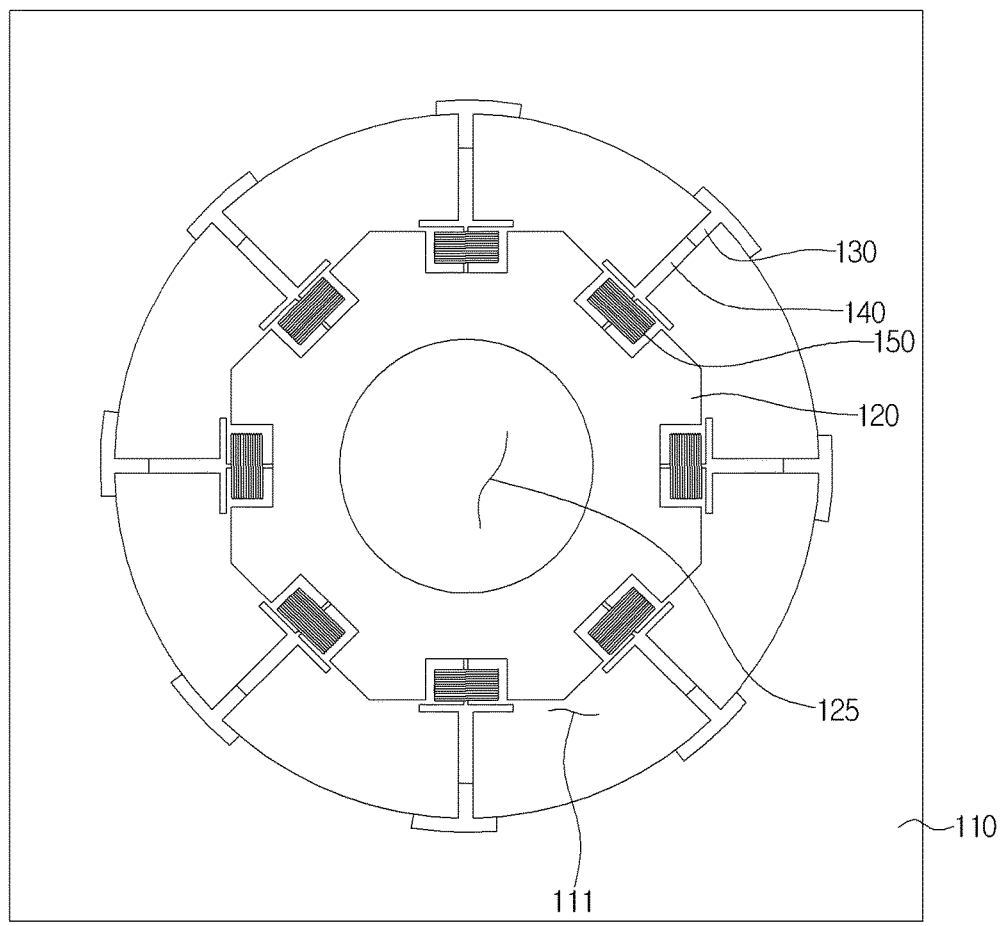

The MEMS device 100B of FIG. 15, as shown in FIG. 1, includes the fixed substrate 110, the elastic unit 500 and the driving unit 120.

The stacked structure of each configuration of the MEMS device 100B is the same as FIG. 2, so its description will be omitted and the upper surface structure will be described.

The MEMS device 100B of FIG. 15 includes the cavity 111 of a circular shape, and the driving unit 120 of a polygonal shape is included in the cavity 111.

The driving unit 120 may have a regular octagonal shape as shown in FIG. 15, and includes the small opening part 121 through each surface.

The multiple elastic units 500 are included between the driving unit 120 and the fixed substrate 110.

Figure 16:
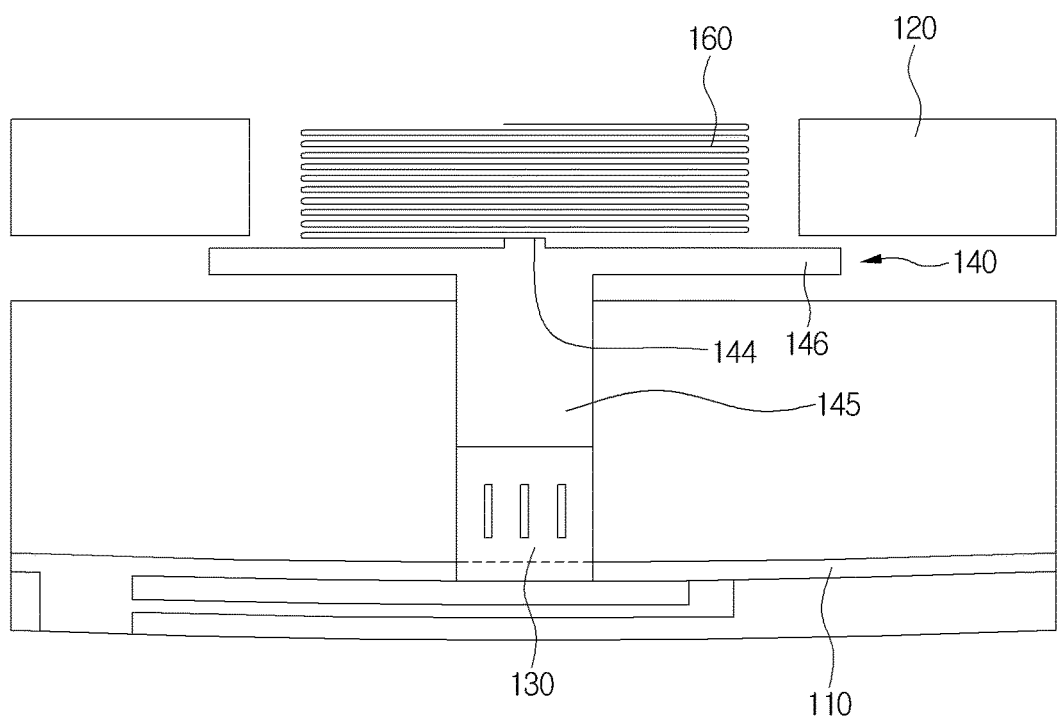

Each elastic unit 500, as shown in FIG. 16, includes the bimorph driving unit 130, the frame 140 and the spring 160.

The bimorph driving unit 130 is extended in a bar shape toward the driving unit 120 from the fixed substrate 110, and the frame 140 is formed between the end of the bimorph driving unit 130 and the spring 160.

The frame 140 is formed in a T shape, one end 145 of the frame is coupled to the bimorph driving unit 130, and a head region 146 of a T shape corresponds along the surface of the driving unit 120.

The other end 144 of the frame 150 is coupled to the spring 160.

The spring 160 is disposed in each small opening part 121, and is formed between the driving unit 120 and the head region 146 of the frame 140.

Figure 17:
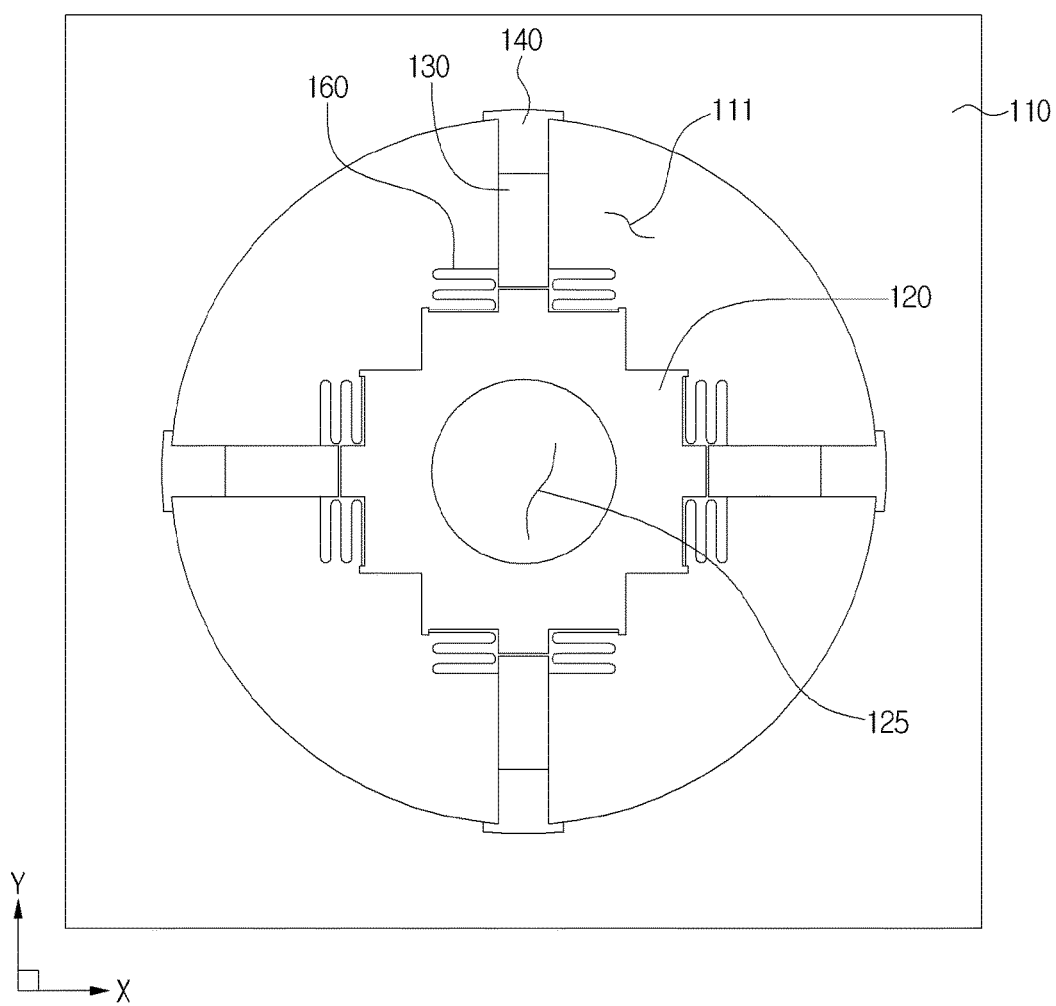

The MEMS device 100C of FIG. 17, as shown in FIG. 1, includes the fixed substrate 110, the elastic unit 500 and the driving unit 120.

The stacked structure of each configuration of the MEMS device 100C is the same as FIG. 2, so its description will be omitted and the upper surface structure will be described.

The fixed substrate 110 of the MEMS device 100C of FIG. 14 includes the cavity 111 of a circular shape, and the driving unit 120 of a polygonal shape is included in the cavity 111.

The driving unit 120, as shown in FIG. 17, may have a polygonal shape, in which each corner area of a tetragonal shape is caved in, and each surface includes two small opening parts 121.

The multiple elastic units 500 are included between the driving unit 120 and the fixed substrate 110.

Each elastic unit 500, as shown in FIG. 17, includes the bimorph driving unit 130, the frame 140 and the spring 160.

The bimorph driving unit 130 is extended in a bar shape toward the driving unit 120 from the fixed substrate 110, and the frame 140 is formed between the end of the bimorph driving unit 130 and the spring 160.

The frame 140 is formed in a bar type, and an end of the frame is coupled to the bimorph driving unit 130, and corresponds to the surface of the driving unit 120.

Both side surfaces of the frame 150 are coupled to each spring 160.

In other words, one ends of the two springs 160 are coupled to both side surfaces of the frame 140, respectively, and the other ends of the springs 160 are coupled to the driving unit 120.

Accordingly, the bimorph driving unit 130 and the frame 140 correspond to each other one to one, and the spring 160 may be formed in multiples of 2 with respect to each frame 140.

Figure 18:
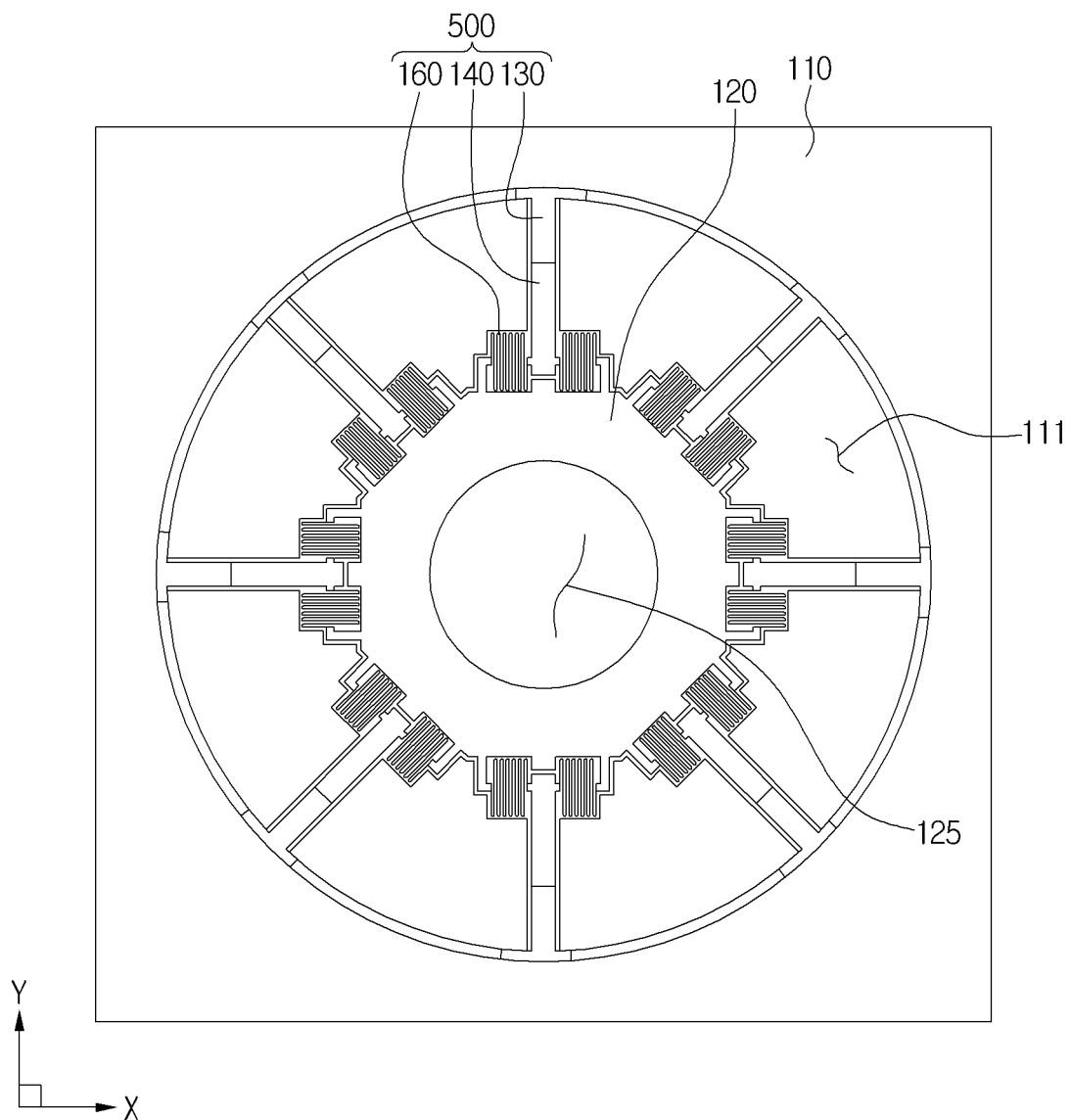

The one to multiple correspondence configuration of FIG. 17 may be applied as shown in FIG. 18.

The MEMS device 100D of FIG. 18 includes 8 elastic units 500, each elastic unit 500 including the bimorph driving unit 130 of a bar type and the frame 140 of a bar type, in which two springs 160 are provided for each side surface of the frame 140.

When coupled as described above, the driving unit 120 may be formed in a polygonal shape having 8 surfaces.

Hereinafter, the camera module, in which the MEMS device of the embodiment is used as the automatic focus driving unit, will be described using FIG. 19.

Figure 19:
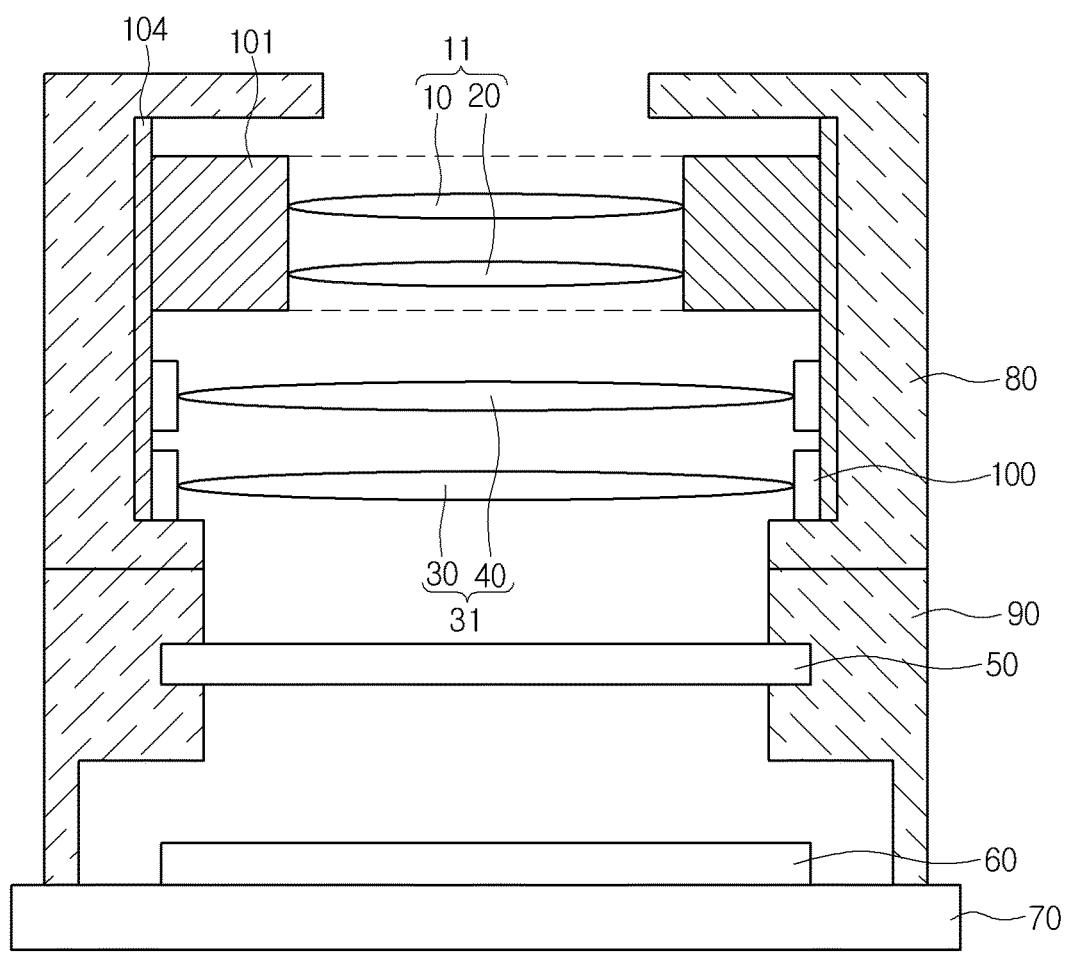
FIG. 19 is a sectional view showing a camera module employing an automatic focus driving device according to the MEMS device.

FIG. 19 is a sectional view showing a camera module, in which the MEMS device of FIG. 1 is used as the automatic focus driving unit.

FIG. 19 arbitrarily shows the lens shape of the photograph lens, and the same reference numbers as the MEMS device described above are given to the automatic focus driving unit.

The camera module includes a housing 80 including a first lens unit 11, a second lens unit 31 and an actuator 104, a holder 90 and a printed circuit board 70.

The housing 80 includes the first lens unit 11, the second lens unit 31 and the actuator 104.

The first lens unit 11 includes a first lens 10 and a second lens 20, and the second lens unit 31 includes a third lens 30 and a fourth lens 40.

In addition, the first lens unit 11 is mounted on a first barrel 101, and the first lens unit 11 and the second lens unit 31 concentrates light to a light receiving device 60 disposed on the printed circuit board 70.

In addition, the first barrel and the second lens unit 31 may be disposed on a cover including the actuator 104.

The automatic focus driving unit 100 supporting the lenses 30 and 40 of the second lens unit 31 may be included in the actuator 104 or separately formed.

The actuator 104 controls the automatic focus driving unit 100 to adjust the position of the lenses 30 and 40 to control the focus, thereby implementing automatic focus and optical zoom functions.

In the case of automatic focusing by moving only one lens, the control current is applied to the automatic focus driving unit 100 supporting the lens 30 or 40 to be moved to control the height of the driving unit 120, thereby varying the position of the lens 30 or 40.

Accordingly, because the automatic focus driving unit 100 adjusts the focus by moving on the lens 30 or 40, the power consumption may be lowered compared to driving the entire lens assembly.

Then, a holder 90 disposed at a lower part of the housing 80 is disposed at a lower part of the second lens unit 31 and includes a filter 50.

The filter 50 may include an infrared light blocking filter.

The filter 50 blocks the radiant heat emitted from the outside light such that the radiant heat is not transferred to the light receiving device 60.

In other words, the filter 50 allows visible light to pass through and reflects the infrared light to the outside.

Although the filter 50 is disposed in the holder 90, the embodiment is not limited thereto, the filter 50 may be selectively disposed between the lenses, or an infrared light blocking material may be coated on the lens of the first lens unit 11 or the second lens unit 31.

In addition, the light receiving device 60, to which an image is formed, may include an image sensor for transforming an optical signal corresponding to the subject image to an electrical signal, and the image sensor may include CCD (Charge Coupled Device) or CMOS(Complementary Metal Oxide Semiconductor) sensors Hereinafter, another embodiment will be described with reference to FIGS. 20 and 21.

Figure 20:
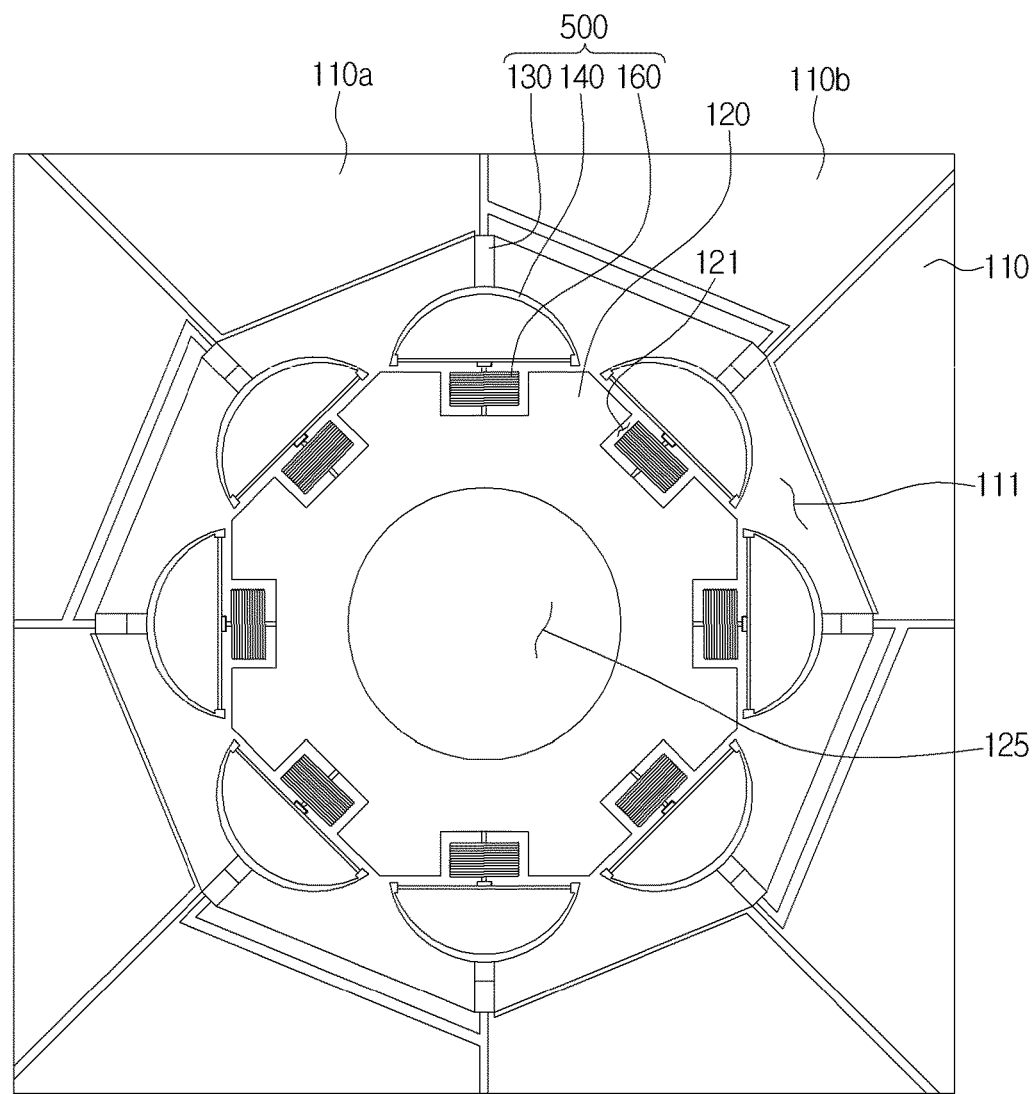
FIGS. 20 and 21 are a top view and an enlarged view, respectively, of the MEMS device according to another embodiment.

Referring to FIG. 20, the MEMS device according to another embodiment includes the fixed substrate 110, the driving unit 120 and the elastic unit 500.

The stacked structure of each configuration of the MEMS device is the same as FIG. 2, so the description will be omitted In the MEMS device of FIG. 20, the fixed substrate 110 includes the cavity 111 to receive the driving unit 120, and the electrode layers of the fixed substrate 110 are separated from each other to form a plurality of fixed electrodes 110a and 110b.

The thermal emission layer 132 of the bimorph driving unit 130 is formed on each of the fixed electrodes 110a and 110b, and the thermal emission layer 132 functions as a circuit pattern.

In the case of the disclosure, the thermal emission layer 132 of each of the bimorph driving unit 130 includes a plurality of patterns 140a, 140b, 140c and 140d crossing between the fixed electrodes 110a and 110b and the frame 140.

In other words, the thermal emission layer 132 includes multiple patterns 140a, 140b, 140c and 140d, and the number of the patterns 140a, 140b, 140c and 140d may be at least two.

Figure 21:
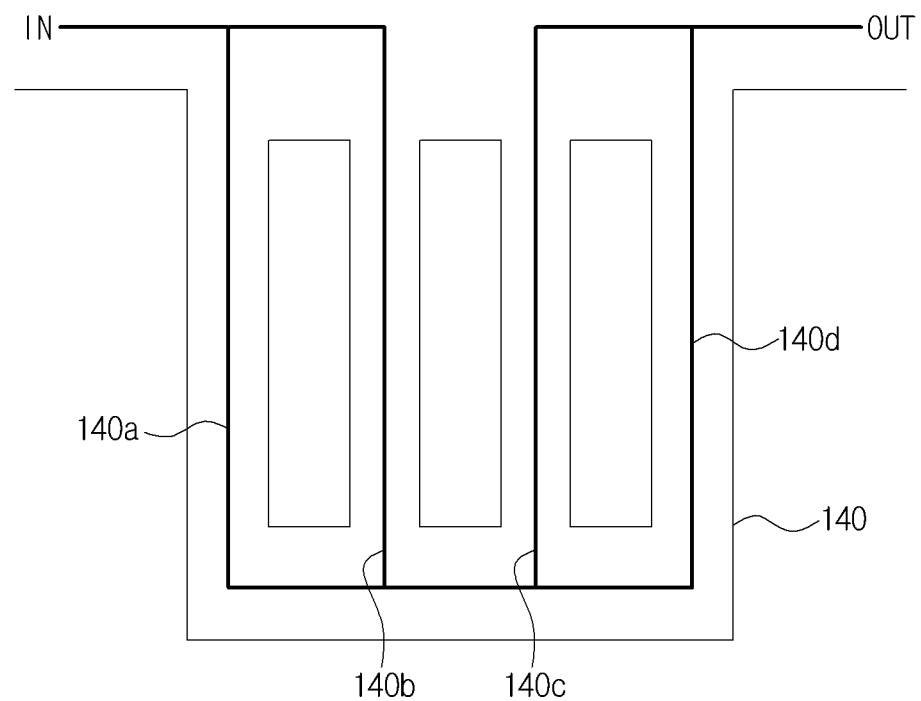

In this case, the number of the patterns 140a, 140b, 140c and 140d may be four as shown in FIG. 21, and the patterns 140a, 140b, 140c and 140d may have the same size.

In this case each of the patterns 140a, 140b, 140c and 140d may satisfy the length and width of 200 μm and 30 μm, respectively.

When the thermal emission layer 132 includes the patterns 140a, 140b, 140c and 140d, mutually different voltages may be applied to the patterns 140a, 140b, 140c and 140d. The fixed electrodes 110a and 110b are coupled to the patterns 140a, 140b, 140c and 140d and mutually different currents may flow to each of the patterns 140a, 140b, 140c and 140d.

A first fixed electrode 110a for applying a positive voltage and a second fixed electrode 110b for applying a negative voltage may be implemented, and the first fixed electrode 110a and the second fixed electrode 110b are separated from each other.

In this case, both ends of the two left patterns 140a and 140b among the 4 patterns are connected to each other and both ends of the two right patterns 140c and 140d are also connected to each other.

When the two left patterns are defined as positive patterns 140a and 140b and the two right patterns are defined as negative patterns 140c and 140d, one ends of the positive patterns 140a and 140b are connected to the first fixed electrode 110a, one ends of the negative patterns 140c and 140d are connected to the second fixed electrode 110a, and the other ends of the positive patterns 140a and 140b and the negative patterns 140c and 140d are serially connected to each other.

Therefore, a current pass is formed along the first fixed electrode 110a and the second fixed electrode 110b, so a predetermined current flows through the bimorph driving unit 140.

When the first fixed electrode 110a and the second fixed electrode 110b applies the same current to the two bimorph driving units 140, a coupling part may be further provided to serially connect the negative pattern 140c and 140d and the positive pattern 140a and 140b of the two driving units 140.

As shown in FIG. 20, by applying different positive voltages to the four fixed electrodes 110a and 110b, mutually different currents may flow through the eight bimorph driving unit 140.

When mutually different currents flow through the bimorph driving unit 140, the value, in which the first and second material layers 134 are enlarged, varies according to each current value.

Therefore, the elastic units 500 move the driving unit 120 by mutually different displacement values, so the driving unit id slantly moved.

The driving unit 120 of the MEMS device may include a reflective layer on the surface, and when the slope angle of the driving unit including the reflective layer is controlled, a reflection mirror may be used.

While the disclosure has been particularly shown and described, the scope of the disclosure is not limited to the described embodiments, but is limited only by the accompanying claims and equivalents thereof, and any alterations equivalent to the accompanying claims are within the scope of the disclosure.

The invention claimed is:

1. A micro electro mechanical systems (MEMS) device comprising:
    a fixed substrate having a first cavity;
    a driving unit disposed in the first cavity, floating above the fixed substrate and having a first opening part formed in the driving unit to receive a lens; and
    a plurality of elastic units for physically coupling the fixed substrate to the driving unit and varying a height of the driving unit according to a control current,
    wherein the driving unit includes a plurality of second cavities divided with each other;
    wherein each elastic unit includes a bimorph driving unit coupled to the fixed substrate and bent according to the control current, a spring coupled to the driving unit and disposed in each second cavity, and a frame coupling the bimorph driving unit to the spring,
    wherein the driving unit includes a plurality of protrusion units protruded from a body of the driving unit and disposed in the plurality of second cavities, respectively,
    wherein each of the second cavities is defined by at least a corresponding first side surface of the fixed substrate, a corresponding second side surface of the fixed substrate and a corresponding third side surface of the fixed substrate, each corresponding protrusion unit to protrude from the third side surface into the corresponding second cavity between the first side surface and the second side surface, each corresponding protrusion unit including a first surface and a second surface, and each of the second cavities is divided into a first region and a second region by each corresponding protrusion unit such that the corresponding first side surface of the fixed substrate faces the first surface of the protrusion unit and the corresponding second side surface of the fixed substrate faces the second surface of the protrusion unit,
    wherein the spring of the each elastic unit includes a first spring disposed in the first region, and a second spring disposed in the second region,
    wherein the first spring is disposed between the corresponding first side surface of the second cavity and the corresponding first surface of the protrusion unit, and the second spring is disposed between the corresponding second side surface of the second cavity and the corresponding second surface of the protrusion unit, wherein the driving unit is in direct physical contact with the lens to adjust a focus by moving the lens, wherein each of the elastic units receives a same amount of the control current, and the driving unit uniformly moves upward from all directions coupled to the elastic units, wherein a first end of the first spring is coupled to the frame and a second end of the first spring is coupled to the first surface of the corresponding protrusion unit, wherein a first end of the second spring is coupled to the frame and a second end of the second spring is coupled to the second surface of the corresponding protrusion unit, and wherein the first spring is not in direct physical contact with the second spring.

2. The MEMS device of claim 1, wherein the bimorph driving unit includes a first material layer, a thermal emission layer disposed on the first material layer, a second material layer disposed on the thermal emission layer, and an insulation layer between the thermal emission layer and the second material layer, and wherein the first material layer and the second material layer have mutually different thermal expansion coefficients.

3. The MEMS device of claim 2, wherein the thermal emission layer emits heat according to the control current.

4. The MEMS device of claim 3, wherein the first material layer has the thermal expansion coefficient lower than the thermal expansion coefficient of the second material layer.

5. The MEMS device of claim 4, wherein the frame includes a first extension unit expanding from an end of the bimorph driving unit, and a second extension unit to connect both ends of the first extension unit, and wherein the first extension unit is configured as an arc.

6. The MEMS device of claim 5, wherein the second extension unit has a straight shape and connects both ends of the first extension unit, and wherein the second extension unit faces each surface of the driving unit, and a length of the second extension unit is shorter than a length of each surface of the driving unit.

7. The MEMS device of claim 6, wherein the first extension unit has a width becoming narrower as the first extension unit is remote from the bimorph driving unit.

8. The MEMS device of claim 7, wherein the bimorph driving unit is extended in a bar shape toward the driving unit from the fixed substrate, and the frame is disposed between the end of the bimorph driving unit and the spring, and wherein the frame is formed as a bar type, and an end of the frame is coupled to the bimorph driving unit, and corresponds to the surface of the driving unit.

9. The MEMS device of claim 3, wherein the thermal emission layer has a plurality of patterns.

10. The MEMS device of claim 9, wherein mutually different voltages are applied to the plurality of the bimorph driving units and the patterns of the thermal emission layer of each bimorph driving unit include patterns to which mutually different voltages are applied and grounded patterns connected to the patterns.

11. The MEMS device of claim 10, wherein the driving unit includes a reflective layer formed on a surface of the driving unit.

12. The MEMS device of claim 1, wherein the first cavity has a plurality of surfaces, and the driving unit has a plurality of surfaces corresponding to the surfaces of the first cavity, and wherein each vertex of the surfaces of the first cavity and each vertex of the surfaces of the driving unit is not aligned with each other.

* * * * *